(12) United States Patent
Yun et al.

(10) Patent No.: US 12,721,011 B2
(45) Date of Patent: Aug. 25, 2026

(54) DISPLAY DEVICE AND METHOD FOR MANUFACTURING THE SAME

(71) Applicant: Samsung Display Co., LTD., Yongin-si (KR)

(72) Inventors: Hyunkyung Yun, Yongin-si (KR); Sangduk Lee, Yongin-si (KR); Hoikwan Lee, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 356 days.

(21) Appl. No.: 18/543,460

(22) Filed: Dec. 18, 2023

(65) Prior Publication Data

US 2024/0268195 A1 Aug. 8, 2024

(30) Foreign Application Priority Data

Feb. 7, 2023 (KR) ........................ 10-2023-0016343

(51) Int. Cl.
*H10K 59/80* (2023.01)
*H10K 59/12* (2023.01)

(52) U.S. Cl.
CPC ....... *H10K 59/873* (2023.02); *H10K 59/1201* (2023.02)

(58) Field of Classification Search
CPC ............. H10K 59/873; H10K 59/1201; H10K 50/844; H10K 71/00; H10K 59/87; H10K 2102/351; H10K 77/111; H10K 2102/311
USPC ........................................................... 257/88
See application file for complete search history.

(56) References Cited

U.S. PATENT DOCUMENTS

| | | | | |
|---|---|---|---|---|
| 8,609,230 | B2 | 12/2013 | Yamamoto et al. | |
| 10,290,685 | B2 | 5/2019 | Oh et al. | |
| 10,658,615 | B2 | 5/2020 | Oh et al. | |
| 11,398,607 | B2 | 7/2022 | Lee et al. | |
| 2008/0002118 | A1 * | 1/2008 | Paek ................. | G02F 1/133305 349/122 |
| 2023/0209870 | A1 * | 6/2023 | Park ..................... | H10K 50/865 257/40 |

FOREIGN PATENT DOCUMENTS

| | | | |
|---|---|---|---|
| KR | 1020170132398 | A | 12/2017 |
| KR | 1020180098445 | A | 9/2018 |
| KR | 1020210113039 | A | 9/2021 |
| KR | 102426130 | B1 | 7/2022 |

* cited by examiner

*Primary Examiner* — Moazzam Hossain
(74) *Attorney, Agent, or Firm* — CANTOR COLBURN LLP

(57) ABSTRACT

A display device includes: a display module and a protective layer disposed on the display module. The protective layer includes: a first protective layer having a first base material, a middle layer disposed on the first protective layer, and a second protective layer disposed on the middle layer and having a second base material different from the first base material. The middle layer includes the first base material and the second base material. The first protective layer, the second protective layer, and the middle layer have respective moduli different from each other.

9 Claims, 11 Drawing Sheets

DD
DM
DP
PF
OPL
ISL
DP-ED
FL2
ML
FL1
OC
P_OH
CPT
TFE
E_OH
PDL
DP-CL
BS
NPXA
PXA-B
PXA-G
PXA-R
CF1
CF2
CF3
EML-1
EML-2
EML-3
EL1-1
EL1-2
EL1-3
IS_C2
IS_L1
IS_C1
IS_L2
CPL
EL2
DR2
DR3

DISPLAY DEVICE AND METHOD FOR MANUFACTURING THE SAME

This application claims priority to Korean Patent Application No. 10-2023-0016343, filed on Feb. 7, 2023, and all the benefits accruing therefrom under 35 U.S.C. § 119, the content of which in its entirety is herein incorporated by reference.

BACKGROUND

The present disclosure herein relates to a display device with improved impact resistance and a method for manufacturing the same.

Multimedia electronic apparatuses such as televisions, mobile phones, tablet computers, navigation systems, and game consoles may include display devices in order to display images. With the development of technologies, various types of display devices are being developed. For example, a flexible display device capable of folding, rolling, or bending is being developed. The flexible display device may include a flexible substrate. However, there is a limitation in that the flexible substrate is vulnerable to external impact, and easily damaged during a manufacturing process of the display device.

A protective layer may be disposed on the uppermost portion of the display device. Impact resistance is desirable for the protective layer included in the flexible display device capable of folding.

SUMMARY

The present disclosure provides a display device with improved impact resistance, and a method for manufacturing the same.

An embodiment of the invention provides a display device including: a display module, and a protective layer disposed on the display module, where the protective layer includes: a first protective layer having a first base material; a middle layer disposed on the first protective layer; and a second protective layer disposed on the middle layer, and having a second base material different from the first base material. The middle layer includes the first base material and the second base material, and a modulus of the first protective layer, a modulus of the second protective layer, and a modulus of the middle layer are different from each other.

In an embodiment, the protective layer may be directly disposed on the display module.

In an embodiment, a thickness of the middle layer may be smaller than a thickness of the first protective layer.

In an embodiment, the protective layer may have a thickness of about 400 micrometers (μm) to about 1 millimeter (mm).

In an embodiment, the modulus of the first protective layer may be smaller than the modulus of the second protective layer.

In an embodiment, the modulus of the first protective layer may be about 0.01 megapascals (MPa) to about 0.1 MPa, and the modulus of the second protective layer may be about 2 gigapascals (GPa) to about 4 GPa.

In an embodiment, the first base material may include at least one of an epoxy polymer or a poly caprolactone (PCL) polymer.

In an embodiment, the second base material may include a polysilsesquioxane-based polymer.

In an embodiment, the display module may include a display panel and an optical layer disposed on the display panel, and the optical layer may include a pigment or a dye.

In an embodiment, the optical layer may include a pattern part in which a plurality of pattern openings are defined and first to third filters overlapping the pattern openings in a plan view, and each of the first to third filters may include the pigment or the dye.

In an embodiment, the optical layer may include a pattern part in which pattern openings are defined, and a light control layer disposed on the pattern part, and the light control layer may include the pigment or the dye.

In an embodiment of the invention, a method for manufacturing a display device includes: preparing a display module which includes a display panel and an optical layer disposed on the display panel, where the optical layer contains a pigment or dye; and forming a protective layer on the display module. The forming of the protective layer includes: providing, on the display module, a first preliminary protective layer having a first base material; providing, on the first preliminary protective layer, a second preliminary protective layer having a second base material different from the first base material; forming, between the first preliminary protective layer and the second preliminary protective layer, a preliminary middle layer having the first base material and the second base material; and forming a first protective layer, a middle layer, and a second protective layer by curing the first preliminary protective layer, the preliminary middle layer, and the second preliminary protective layer, respectively. The first protective layer, the second protective layer, and the middle layer have respective moduli different from each other.

In an embodiment, the first preliminary protective layer may include about 5 percentages by weight (wt %) to about 20 wt % of a solvent with respect to a total weight of the first preliminary protective layer.

In an embodiment, the second preliminary protective layer may include about 5 wt % to about 20 wt % of a solvent with respect to a total weight of the second preliminary protective layer.

In an embodiment, the first preliminary protective layer may include a first solvent, the second preliminary protective layer may include a second solvent, and the first solvent may be the same as the second solvent.

In an embodiment, the providing of the preliminary middle layer may include dissolving the first preliminary protective layer using the second solvent.

In an embodiment, the forming of the preliminary middle layer may further include removing the first and second solvents by drying each of the first preliminary protective layer, the preliminary middle layer, and the second preliminary protective layer.

In an embodiment, after the drying, a proportion of sum of the first and second solvents included in each of the first preliminary protective layer, the preliminary middle layer, and the second preliminary protective layer may be about 0 wt % to about 3 wt % with respect to a total weight of a corresponding layer.

In an embodiment, the method may further include, before the providing of the second preliminary protective layer, subjecting the first preliminary protective layer to pre-drying and temporary-curing.

In an embodiment, the forming of the preliminary middle layer may be performed between the providing of the first preliminary protective layer and the providing of the second preliminary protective layer.

BRIEF DESCRIPTION OF THE FIGURES

The accompanying drawings are included to provide a further understanding of the invention, and are incorporated in and constitute a part of this specification. The drawings illustrate embodiments of the invention and, together with the description, serve to explain principles of the invention. In the drawings.

DETAILED DESCRIPTION

Figure 1:
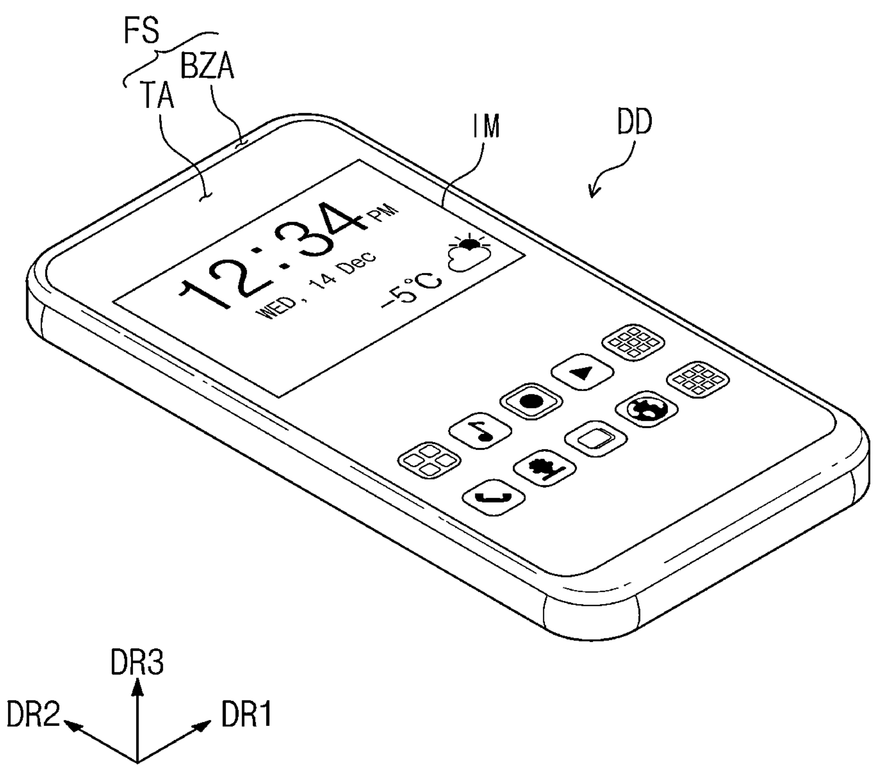
FIG. 1 is a perspective view of a display device according to an embodiment of the invention.

Embodiments of the invention will be described below in more detail with reference to the accompanying drawings. The invention may, however, be embodied in different forms and should not be construed as limited to the embodiments set forth herein. Rather, these embodiments are provided so that this disclosure will be thorough and complete, and will fully convey the scope of the invention to those skilled in the art.

In this specification, it will be understood that when an element (or a region, a layer, a portion, or the like) is referred to as being "on", "connected to" or "coupled to" another element, it may be directly disposed on, connected or coupled to the other element, or intervening elements may be disposed therebetween.

Like reference numerals or symbols refer to like elements throughout. In the drawings, the thickness, the ratio, and the size of the element are exaggerated for effective description of the technical contents.

As used herein, the term "and/or" includes any and all combinations of one or more of the associated listed items.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the scope of the invention. Similarly, a second element, component, region, layer or section may be termed a first element, component, region, layer or section. As used herein, the singular forms, "a", "an" and "the" are intended to include the plural forms as well, unless the context clearly indicates otherwise.

Also, terms of "below", "on lower side", "above", "on upper side", or the like may be used to describe the relationships of the elements illustrated in the drawings. These terms have relative concepts and are described on the basis of the directions indicated in the drawings.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

It will be further understood that the terms "includes" and/or "have", when used in this specification, specify the presence of stated features, integers, steps, operations, elements, components, and/or groups thereof, but do not preclude the presence or addition of one or more other features, integers, steps, operations, elements, components, and/or groups thereof.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value. Hereinafter, embodiments of the invention will be described with reference to the accompanying drawings.

Figure 2:
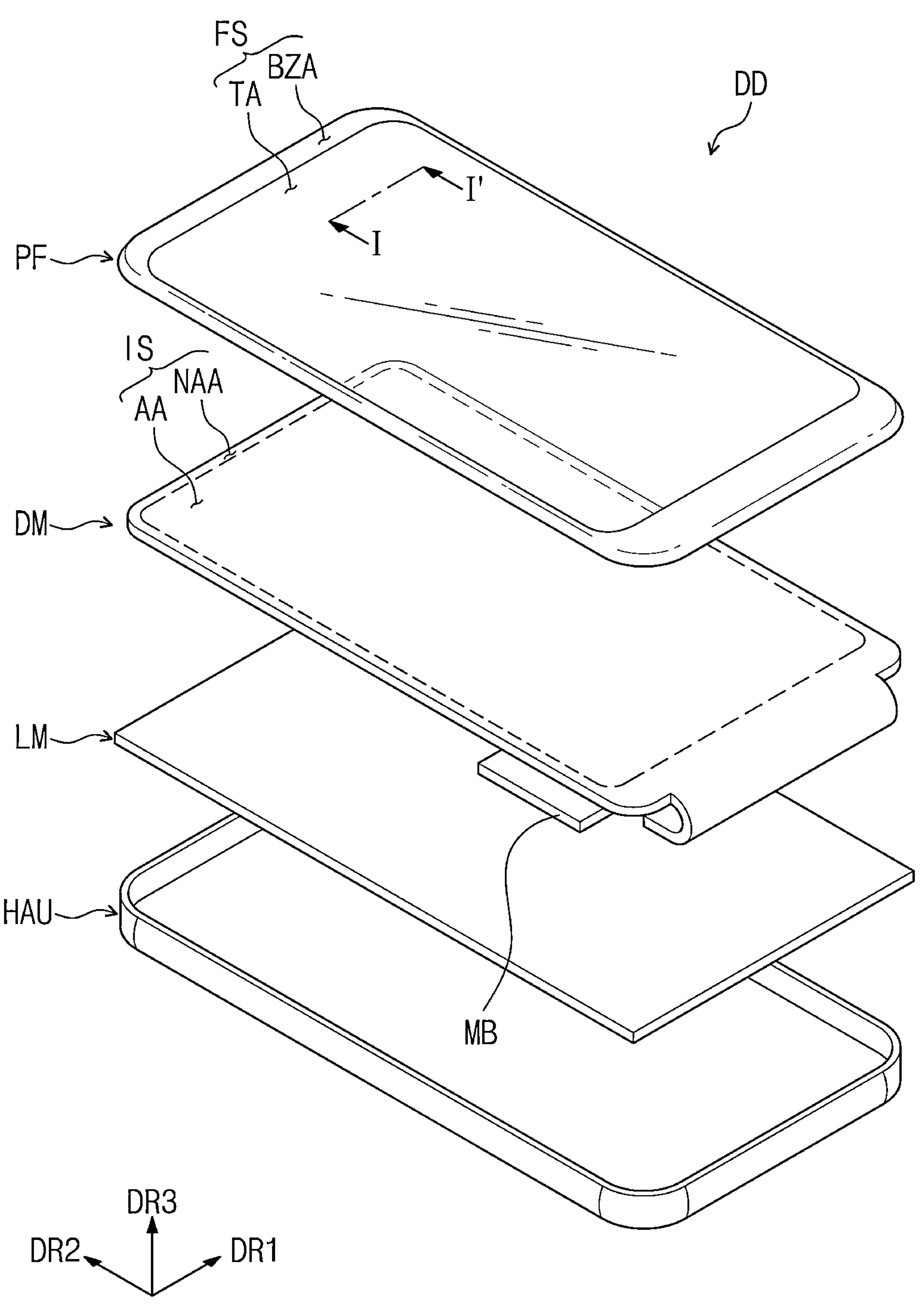
FIG. 2 is an exploded perspective view of a display device according to an embodiment of the invention.

FIG. 1 is a perspective view of a display device according to an embodiment of the invention. FIG. 2 is an exploded perspective view of a display device according to an embodiment of the invention.

Referring to FIGS. 1 and 2, a display device DD may be activated in response to electrical signals, and may display an image IM. In an embodiment, for example, the display device DD may include a monitor, a mobile phone, a tablet computer, a navigation system, a game console, or the like. However, the aforementioned examples of the display device DD are illustrative, and the display device DD is not limited to any one embodiment unless deviating from the scope of the invention. In this embodiment, the display device DD is exemplarily illustrated as a mobile phone.

The display device DD may have a rectangular shape having, on a plane, short sides extending in a first direction DR1 and having long sides extending in a second direction DR2 crossing the first direction DR1. However, an embodiment of the invention is not limited thereto, and the display device DD may have various shapes such as a circular or polygonal shape on a plane.

In this embodiment, a third direction DR3 may be defined as a direction perpendicular to a plane defined by the first direction DR1 and the second direction DR2. A front surface (or upper surface) and a rear surface (or lower surface) of each of members constituting the display device DD may oppose to each other in the third direction DR3, and the normal direction of each of the front surface and the rear surface may be substantially parallel to the third direction DR3. A distance between the front surface and the rear surface of the member defined along the third direction DR3 may correspond to the thickness of the member.

In this specification, the term "on a plane" may be defined as a state of being viewed in the third direction DR3 (i.e., in a plan view). In this specification, the term "on a cross-section" may be defined as a state of being viewed in the first direction DR1 or the second direction DR2. Directions indicated by the first through third directions DR1, DR2, and DR3 may be relative concepts, and may be changed to other directions.

The display device DD may be rigid or flexible. To be "flexible" means to have bending characteristics, and the bending characteristics may include any structure from a completely foldable structure to a structure bendable to the nanometer level. In an embodiment, for example, the flexible display device DD may include a curved device, a foldable device, or a rollable device.

The display device DD may display the image IM through a display surface FS parallel to each of the first direction DR1 and the second direction DR2. The image IM may include a still image as well as a dynamic image. FIG. 1 illustrates a clock and a plurality of icons as an example.

The display surface FS of the display device DD may include only a flat surface, or may further include a curved surface bent from at least one side of the flat surface. The display surface FS may correspond to a front surface of the display device DD, and may also correspond to a front surface of a protective layer PF. Hereinafter, the display surface FS of the display device DD and the front surface FS of the protective layer PF are denoted as the same reference numeral or symbol.

The display device DD according to an embodiment may detect an external input applied from the outside. The external input may include various types of inputs such as power, pressure, temperature, or light. The external input may include an input applied close to the display device DD, as well as an input of touch on the display device DD.

The display device DD may detect a user's input through the display surface FS defined on the front surface, and may respond to the detected input signal. However, the region of the display device DD detecting the external input is not limited to the front surface of the display device DD, and may be changed according to a design of the display device DD. In an embodiment, for example, the display device DD may also detect a user's input applied to a side surface or a rear surface of the display device DD.

The display device DD may include a protective layer PF, a display module DM, a lower module LM, and a housing HAU. The protective layer PF may be coupled to the housing HAU to form the exterior of the display device DD.

The protective layer PF may be disposed on the display module DM. The protective layer PF may cover a front surface IS of the display module DM, and protect the display module DM from external impact and scratches. Since an adhesive may be omitted, the protective layer PF may be bonded to the display module DM through, for example, direct coating.

The protective layer PF may be a component that protects the display module DM, etc., disposed thereunder. The protective layer PF may be optically transparent. In an embodiment, for example, the protective layer PF may have a transmittance of at least about 85% or at least 90% in a visible light range. The image generated in the display module DM may pass through the protective layer PF to be provided to a user.

According to an embodiment of the invention, the protective layer PF may be directly disposed on the display module DM. An adhesive member may not be disposed between the protective layer PF and the display module DM. The protective layer PF may not include a glass substrate (or a glass layer, a glass material, etc.). In addition, the glass substrate may not be disposed between the display module DM and the protective layer PF. The protective layer PF may be disposed on the uppermost portion of the display device DD.

In a method for manufacturing a display device according to an embodiment to be described later, the protective layer PF may be directly formed on the display module by coating and curing the composition. In providing the protective layer PF on a separate temporary member, a manufacturing operation may be added, thus resulting in an increase in the manufacturing cost and time. Accordingly, the protective layer PF may not include a glass material (or substrate). The protective layer PF will be described in detail later.

The front surface FS of the protective layer PF may correspond to the front surface of the display device DD as previously described. The front surface FS of the protective layer PF may include a transmission region TA and a bezel region BZA.

The transmission region TA may be an optically transparent region. The transmission region TA may transmit the image IM provided from the display module DM. In this embodiment, the transmission region TA is illustrated in a quadrangle. However, the transmission region TA may have various shapes, and is not limited to any one embodiment.

The bezel region BZA may have a lower light transmittance than the transmission region TA. The bezel region BZA may correspond to a region printed with a material having a predetermined color. The bezel region BZA may prevent light from passing therethrough, and may prevent some components of the display module DM disposed overlapping the bezel region BZA from being visible from the outside.

The bezel region BZA may be adjacent to the transmission region TA. The shape of the transmission region TA may be substantially defined by the bezel region BZA. For example. The bezel region BZA may be disposed on the outer side of the transmission region TA, and may surround the transmission region TA. However, this is exemplarily illustrated, and the bezel region BZA may be adjacent to only one side of the transmission region TA, or may be disposed in a side surface, not the front surface, of the display device DD. Alternatively, the bezel region BZA may also be omitted.

The display module DM may be disposed under the protective layer PF. The display module DM may display the image IM, and detect the external input. The image IM may be displayed on the front surface IS of the display module DM. The front surface IS of the display module DM may include an active region AA and a peripheral region NAA.

The active region AA may be activated in response to electrical signals. The active region AA may be a region in which the image IM is displayed. According to an embodiment, the active region AA may be a region in which the external input is detected. The active region AA may overlap at least a portion of the transmission region TA in a plan view. Accordingly, a user may view the image IM displayed in the active region AA through the transmission region TA.

The peripheral region NAA may be adjacent to the active region AA. In an embodiment, for example, the peripheral region NAA may surround the active region AA. A driving circuit, driving wires, or the like for driving the active region AA may be disposed in the peripheral region NAA. The peripheral region NAA may overlap at least a portion of the bezel region BZA in a plan view, and the bezel region BZA may prevent components disposed in the peripheral region NAA from being viewed from the outside.

The display module DM may include a display panel which displays the image IM. The display module DM may further include an input-sensing layer which detects the external input. The display module DM will be described in detail later.

One portion of the display module DM may be bendable with respect to a bending axis extending in the first direction DR1. That is, the one portion of the display module DM may be bendable toward the rear surface of the other portion of the display module DM which corresponds to the active region AA. A circuit board MB may be connected to the bent one portion of the display module DM, and the circuit board MB may overlap the display module DM on a plane.

The circuit board MB may be disposed on one side of the display module DM, and electrically connected to the display module DM. The circuit board MB may generate electrical signals to be provided to the display module DM, or receive signals generated from the display module DM, thereby calculating a result value including information on a location in which an external input is detected, or the intensity of the detected external input.

The lower module LM is disposed on the rear surface of the display module DM. The lower module LM may improve the impact resistance of the display device DD as being disposed on the rear surface of the display module DM. The lower module LM may be fixed on the rear surface of the display module DM through an adhesive film. The adhesive film may be a pressure sensitive adhesive ("PSA"), an optical clear adhesive ("OCA"), or an optical clear resin ("OCR"). Although not illustrated in the drawing, when one portion of the display module DM (for example, a portion including the circuit board MB) is bent, the circuit board MB of the display module DM may be disposed on a rear surface of the lower module LM.

The housing HAU may be coupled to the window WM to provide an inner space that accommodates the display module DM and the circuit board MB. The housing HAU may include a material with relatively high rigidity. In an embodiment, for example, the housing HAU may include a plurality of frames and/or plates containing glass, plastic, or metal, or a combination thereof. The housing HAU may absorb impact applied from the outside, or prevent foreign substances/moisture from penetrating from the outside, thereby protecting the components, of the display device DD, accommodated in the housing HAU.

Figure 3:
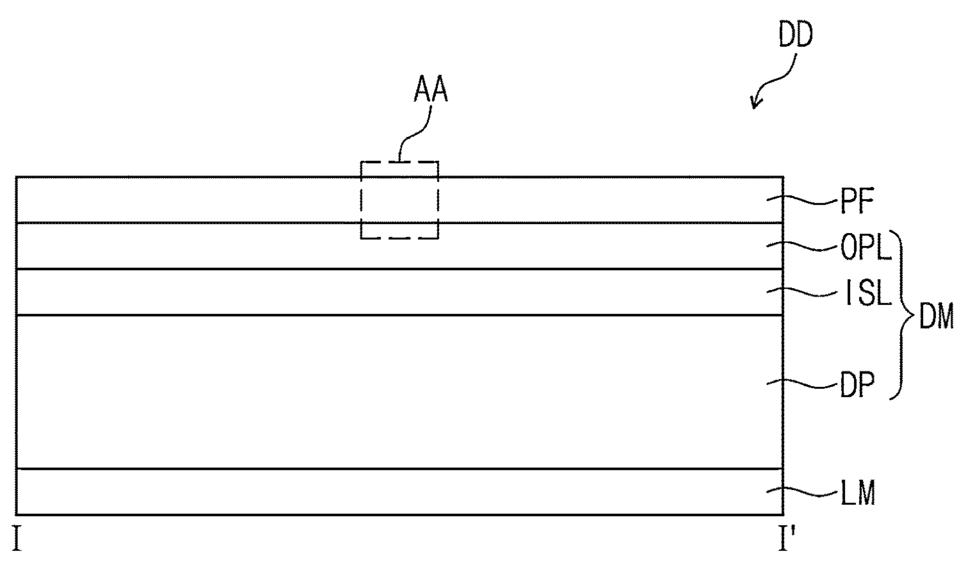
FIG. 3 is a cross-sectional view taken along line I-I' of FIG. 1.

FIG. 3 is a cross-sectional view taken along line I-I' of FIG. 2.

Referring to FIG. 3, a display device DD may include a display module DM and a protective layer PF disposed on the display module DM. In addition, the display device DD may further include a lower module LM disposed under the display module DM.

In this specification, when one element is directly disposed on another element, there is no intervening element disposed therebetween. That is, when one element is "directly disposed" on another element, the one element is "in contact with" the other element.

According to an embodiment of the invention, the protective layer PF may be directly disposed on the display module DM. The protective layer PF may include a first protective layer FL1 (see FIG. 4), a middle layer ML (see FIG. 4), and a second protective layer FL2 (see FIG. 4). Accordingly, the display device DD including the protective layer PF may have excellent impact resistance. Detailed description thereof will be made later.

The display module DM may generate an image, and detect an input applied from the outside. The display module DM may include a display panel DP and an optical layer OPL disposed on the display panel DP. In addition, the display module DM may further include an input-sensing layer ISL disposed between the display panel DP and the optical layer OPL.

The display panel DP may be a component that substantially generates an image. The display panel DP may be an emission-type display panel, and for example, the display panel DP may be an organic light-emitting display panel, an inorganic light-emitting display panel, a quantum-dot display panel, a micro-LED display panel, or a nano-LED display panel. The display panel DP may be referred to as a display layer.

The input-sensing layer ISL may be disposed on the display panel DP. In an embodiment, for example, the input-sensing layer ISL may be directly disposed on an encapsulation layer TFE (see FIG. 6) of the display panel DP. The input-sensing layer ISL may detect an external input, convert the detected external input to a predetermined input signal, and provide the input signal to the display panel DP. In an embodiment, for example, the input-sensing layer ISL may be a touch-sensing layer that detects a touch. The input-sensing layer ISL may perceive a user's touch, or a touch using an object.

The input-sensing layer ISL may detect at least one of a location or intensity (pressure) of a touch applied from the outside. The input-sensing layer ISL may have various structures, or may be composed of various materials, and is not limited to any one embodiment. In an embodiment, for example, the input-sensing layer ISL may detect an external input in a capacitive manner. The input sensing layer ISL may provide an input signal to the display panel DP through a separate driving circuit, and the display panel DP may generate an image corresponding to the input signal.

The optical layer OPL may be disposed on the input-sensing layer ISL. The optical layer OPL may include a dye or pigment. The optical layer OPL may selectively transmit light emitted from the display panel DP. The optical layer OPL may reduce the reflectance for external light incident from the outside. The optical layer OPL does not include a polarizer. The display device DD according to an embodiment of the invention may not include a polarizer. The display device DD not including a polarizer may include the protective layer PF, and may thus have improved impact resistance.

The lower module LM may be disposed on the rear surface of the display module DM. The lower module LM may be a layer that is disposed on the rear surface of the display module DM to protect the rear surface of the display module DM. The lower module LM may overlap the entire display module DM in a plan view. The lower module may include a separate cushion layer. The cushion layer may protect the display module DM from external impact and power. In an embodiment, for example, the cushion layer may include an elastomer, such as a sponge, a foam, or a urethane resin, and the like. In addition, the cushion layer may be formed by including at least one of an acrylate-based polymer, a urethane-based polymer, a silicon-based polymer, or an imide-based polymer.

Although not illustrated in the drawing, a support plate that supports the display module may be provided under the lower module LM. A support layer may be a layer that supports the display module DM under the lower module LM. The support plate may include a metal material, a polymer material, a non-metal material, plastic, glass fiber reinforced plastic, or glass.

Figure 4:
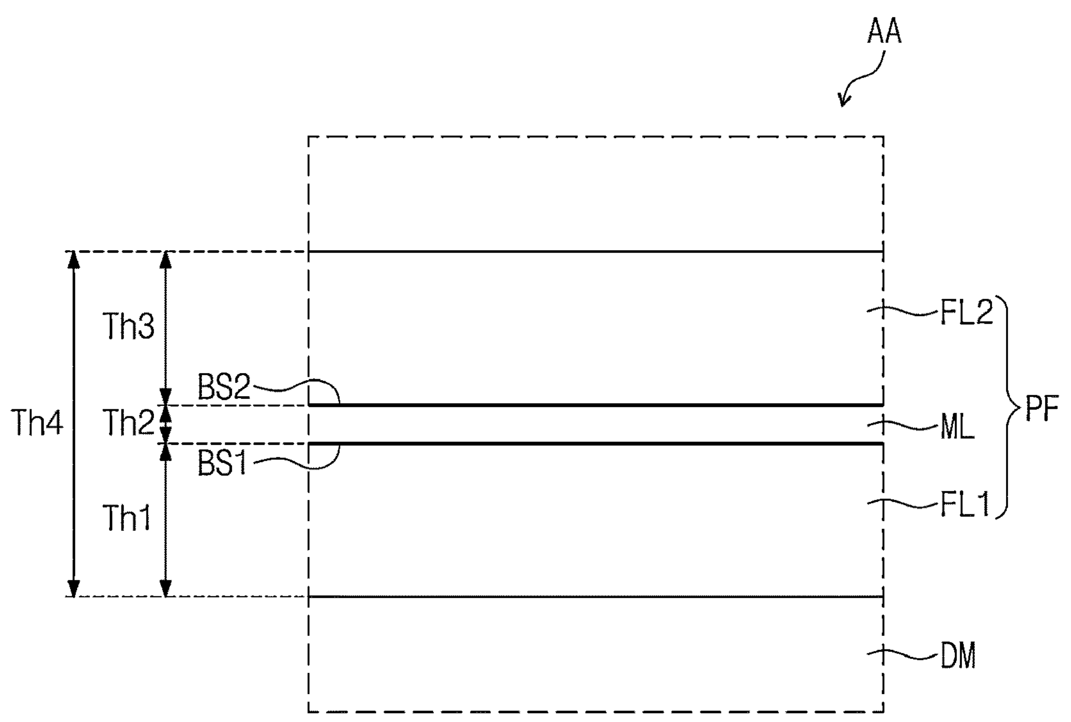
FIG. 4 is an enlarged view of region AA illustrated in FIG. 3.

FIG. 4 is an enlarged view of region AA illustrated in FIG. 3. In particular, FIG. 4 is an enlarged cross-sectional view of a protective layer PF according to an embodiment of the invention.

Referring to FIG. 4, the protective layer PF may include a first protective layer FL1, a middle layer ML, and a second protective layer FL2. The first protective layer FL1 may be directly disposed on the display module DM. The middle layer ML may be disposed on the first protective layer FL1, and the second protective layer FL2 may be disposed on the middle layer ML. According to an embodiment of the invention, a first boundary surface BS1 may be defined between the middle layer ML and the first protective layer FL1, and a second boundary surface BS2 may be defined between the middle layer ML and the second protective layer FL2.

The first protective layer FL1 may include a first base material. The first base material may include at least one of an epoxy-based resin, a urethane-based resin, an acrylate-based resin, or a silicon-based resin. In an embodiment, for example, the first base material may include at least one of an epoxy-based resin or a poly caprolactone (PCL)-based resin. However, an embodiment of the invention is not limited thereto, and the epoxy-based resin may be formed from a composition containing the same epoxy-based monomer, but containing other different components (for example, an oligomer, additive, etc.) in another embodiment. In a method for manufacturing a display device according to an embodiment to be described later, the first protective layer FL1 may be formed by applying and curing the composition, and may further include a small amount of a first solvent. The first solvent may include propylene glycol methyl ether ("PGME") or propylene glycol methyl ether acetate ("PGMEA"). The first protective layer FL1 may include about 0 percentages by weight (wt %) to about 3 wt % of the first solvent with respect to a total weight of the first protective layer FL1.

The second protective layer FL2 may include a second base material. The second base material may include at least one of an epoxy-base resin, a urethane-based resin, an acrylate-based resin, or a silicon-based resin. The second base material may be different from the first base material. In an embodiment, for example, the second base material may include a polysilsesquioxane-based resin. However, an embodiment of the invention is not limited thereto, and the epoxy-based resin may be formed from a composition containing the same epoxy-based monomer, but containing other different components (for example, an oligomer, additive, etc.) in another embodiment. In a method for manufacturing a display device according to an embodiment to be described later, the second protective layer FL2 may be formed by applying and curing the composition, and may include a small amount of a second solvent. The second solvent may include methyl isobutyl ketone ("MIBK"), propylene glycol methyl ether (PGME), or propylene glycol methyl ether acetate (PGMEA). The second protective layer FL2 may include about 0 wt % to about 3 wt % of the second solvent with respect to a total weight of the second protective layer FL2.

The middle layer ML may include the first base material included in the first protective layer FL1, and the second base material included in the second protective layer FL2. The first and second base materials may be mixed together and evenly distributed inside the middle layer ML. The first and second base materials may be included in the middle layer ML in equal proportions, but an embodiment of the invention is not limited thereto.

According to an embodiment of the invention, the first protective layer FL1 may have a smaller modulus than a modulus of the second protective layer FL2. In particular, the modulus of the first protective layer FL1 may be about 0.01 megapascals (MPa) to about 0.1 MPa, and the modulus of the second protective layer FL2 may be about 2 gigapascals (Gpa) to about 4 Gpa. The middle layer ML may have a modulus different from the modulus of each of the first protective layer FL1 and the second protective layer FL2. Since the protective layer PF according to an embodiment of the invention includes three layers having different moduli from each other, the display device DD (see FIG. 3) according to an embodiment of the invention may have improved impact resistance. The protective layer PF may have a modulus of about 4 Gpa to about 5 GPa.

The first protective layer FL1 may have a first thickness Th1 of about 200 micrometers (μm) to about 400 m. In an embodiment, for example, the first thickness Th1 may be about 200 μm to about 250 μm. However, this is an example, and the first thickness Th1 of the first protective layer FL1 is not limited thereto. According to an embodiment of the invention, the middle layer ML may have a second thickness Th2 different from the first thickness Th1. The second thickness Th2 may be smaller than the first thickness Th1. In an embodiment, for example, the second thickness Th2 may be about 10 μm to about 300 μm. However, this is an example, and the second thickness Th2 of the middle layer ML is not limited thereto. The second protective layer FL2 may have a third thickness Th3 of about 100 μm to about 600 μm. In an embodiment, for example, the third thickness Th3 may be about 200 μm to about 300 μm. However, this is an example, and the third thickness Th3 of the second protective layer FL2 is not limited thereto.

The first thickness Th1, the second thickness Th2, and the third thickness Th3 may be changed according to the respective base materials included in the first protective layer FL1, the second protective layer FL2, and the middle layer ML. In a method for manufacturing a display device according to an embodiment to be described later, the first protective layer FL1 and the second protective layer FL2 may be formed by applying and curing the respective compositions, and in the process of forming the middle layer ML, respective portions of the first protective layer FL1 and the second protective layer FL2 are dissolved to form the middle layer ML. Accordingly, the first thickness Th1 and the third thickness Th3 may be changed according to the second thickness Th2 of the middle layer ML. That is, as the second thickness is larger, the first thickness Th1 and the third thickness Th3 may become smaller.

The protective layer PF according to an embodiment of the invention may have a fourth thickness Th4 of about 400 μm to about 1 millimeter (mm). When the thickness of the protective layer PF is less than about 400 μm, the protective layer PF may be vulnerable to external impact, and when the thickness of the protective layer PF is greater than about 1 mm, the thickness of the display device DD may increase. According to an embodiment of the invention, the protective layer PF having the fourth thickness Th4 of about 400 μm to about 1 mm may have excellent impact resistance while preventing the display device DD from becoming thicker.

Figure 5:
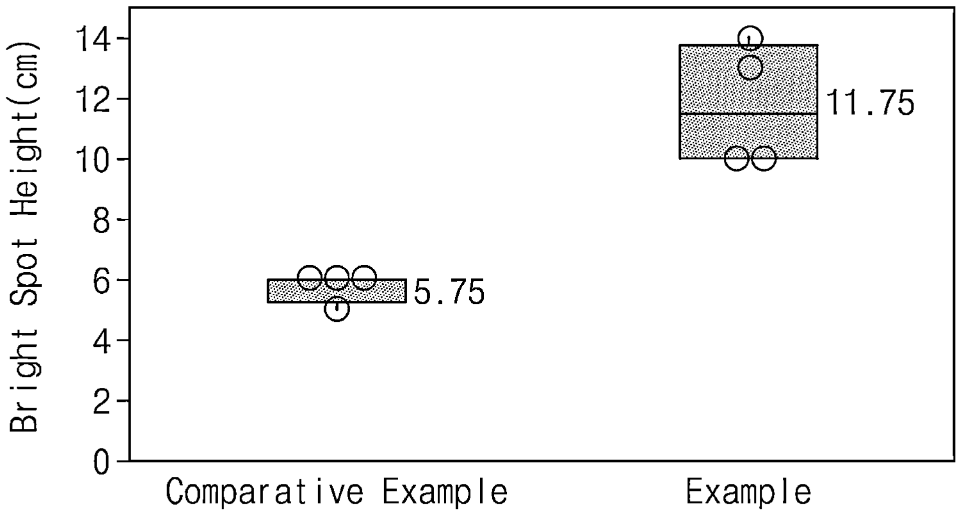
FIG. 5 is a graph showing bright spot heights of protective layers measured in a comparative example and an experimental example, respectively.

FIG. 5 is a graph showing respective bright spot heights of protective layers measured in a comparative example and an experimental example. The bright spot heights in FIG. 5 are measured through a Dupont tester (a product of Qmesys), and in particular, the bright spot heights are measured using an impact jig having a diameter of about 6.5 mm. The bright spot height is an average value obtained by averaging four measurements.

The graph in FIG. 5 shows the bright spot height according to the comparative example and the bright spot height according to the experimental example. The experimental example represents the bright spot height of the protective layer PF (see FIG. 4) according to an embodiment of the invention, and the comparative example represents the bright spot height of a protective layer in which the middle layer ML is omitted from the protective layer PF according to an embodiment of the invention. In this evaluation, if the bright spot height exceeds a reference value (for example, about 7 cm), the protective layer may be determined to be satisfactory, and if less than the reference value, it may be determined to be faulty.

It may be seen that the bright spot height of the protective layer in the comparative example is 5.75 cm that is less than the reference value. The protective layer in the comparative example includes two layers having different moduli from each other, and accordingly, through the Dupont test, it may be known that the protective layer has low impact resistance. In addition, since the protective layer in the comparative example was evaluated as having low pencil hardness through a pencil hardness test using ASTM D3363, damage to a surface of the protective layer may occur.

It may be seen that the bright spot height of the protective layer PF in the experimental example is measured above the reference value, particularly as 11.75 cm. Referring to FIG. 4 together, the protective layer PF according to an embodiment of the invention may include three layers having different moduli from each other, and have a thickness of about 400 μm to about 1 mm, thereby ensuring excellent impact resistance. Moreover, the protective layer PF may have a pencil hardness of at least about 3H as measured in accordance with ASTM D3363. The protective layer PF having a pencil hardness of at least about 3H as measured in accordance with ASTM D3363 may have excellent impact resistance.

Figure 6:
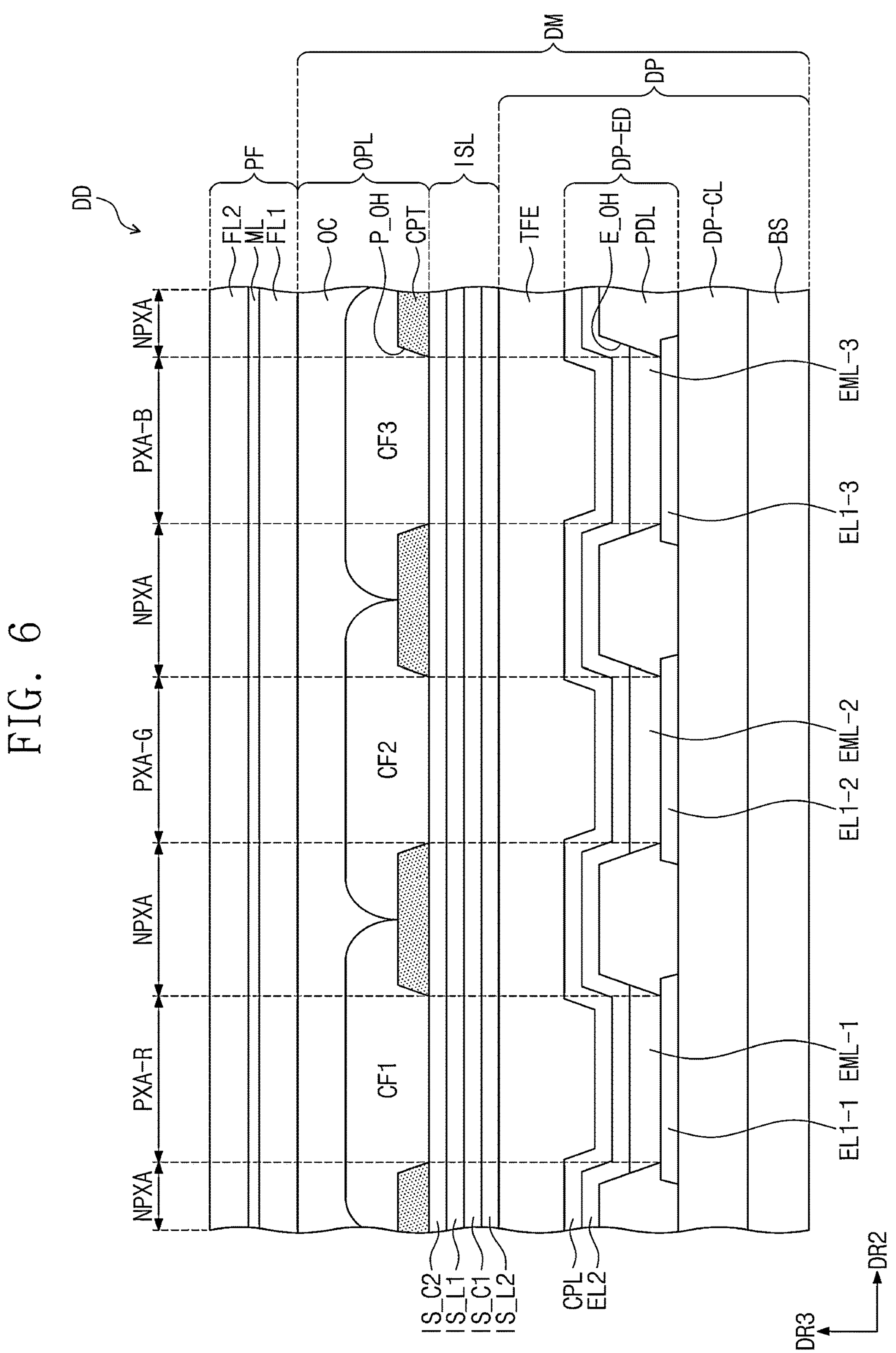
FIG. 6 is a cross-sectional view of a display device according to an embodiment of the invention.

FIG. 6 is a cross-sectional view of a display device according to an embodiment of the invention. Hereinafter, the duplicate description of the protective layer PF that has been previously described will be omitted.

Referring to FIG. 6, a display device DD may include a display module DM and a protective layer PF. The display module DM may include a display panel DP, an input-sensing layer ISL, and an optical layer OPL. The display panel DP may include a base layer BS, a circuit layer DP-CL disposed on the base layer BS, a display element layer DP-ED disposed on the circuit layer DP-CL, and an encapsulation layer TFE disposed on the display element layer DP-ED.

The base layer BS may be a member that provides a base surface on which the display element layer DP-ED is disposed. The base layer BS may be a glass substrate, a metal substrate, a polymer substrate, etc. However, an embodiment of the invention is not limited thereto, and the base layer BS may be an inorganic layer, an organic layer, or a composite material layer in another embodiment.

The base layer BS may include a single layer, or multiple layers. In an embodiment, for example, the base layer BS may include a first synthetic resin layer, a multi-layer or single-layer inorganic layer, and a second synthetic resin layer disposed above the multi-layer or single-layer inorganic layer. Each of the first synthetic resin layer and the second synthetic resin layer may include a polyimide-based resin. In addition, each of the first synthetic resin layer and the second synthetic resin layer may include at least one of an acrylate-based resin, a methacrylate-based resin, a polyisoprene-based resin, a vinyl-based resin, an epoxy-based resin, a urethane-based resin, a cellulose-based rein, a siloxane-based resin, a polyamide-based resin, or a perylene-based resin. In this specification, "~~-based" resin refers to a resin including a functional group of "~~".

The circuit layer DP-CL may include an insulation layer, a semiconductor pattern, a conductive pattern, a signal line, and the like. The circuit layer DP-CL may include a plurality of transistors (not shown). The transistors (not shown) may each include a control electrode, an input electrode, and an output electrode. In an embodiment, for example, the circuit layer DP-CL may include a switching transistor and a driving transistor for driving components (for example, a first electrode, a light-emitting layer, and a second electrode) of the display element layer DP-ED.

The display element layer DP-ED may include pixel-defining films PDL in which pixel openings E_OH are defined, first electrodes EL1-1, EL1-2, and EL1-3 exposed in the pixel openings E_OH, and light-emitting layers EML-1, EML-2, and EML-3 disposed on the first electrodes EL1-1, EL1-2, and EL1-3, respectively, and a second electrode EL2 disposed on the light-emitting layers EML-1, EML-2, and EML-3.

The display panel DP may be divided into light-emitting regions PXA-R, PXA-G, and PXA-B, and non-light-emitting regions NPXA. The light-emitting regions PXA-R, PXA-G, and PXA-B may be spaced apart from each other on a plane. The light-emitting regions PXA-R, PXA-G, and PXA-B may be regions in which light generated from the display element layer DP-ED is emitted. The light-emitting regions PXA-R, PXA-G, and PXA-B may include a first light-emitting region PXA-R, a second light-emitting region PXA-G, and a third light-emitting region PXA-B that are distinguished from one another. The first light-emitting region PXA-R may correspond to a red light-emitting region, the second light-emitting region PXA-G may correspond to a green light-emitting region, and the third light-emitting region PXA-B may correspond to a blue light-emitting region. The light-emitting regions PXA-R, PXA-G, and PXA-B may each be separated by the pixel-defining film PDL. The non-light-emitting regions NPXA may be regions between the light-emitting regions PXA-R, PXA-G, and PXA-B adjacent to each other, and may correspond to the pixel-defining films PDL.

The pixel-defining films PDL may have light-absorbing characteristics. The pixel-defining films PDL may include a black coloring agent. The black coloring agent may include a black dye or black pigment. The black coloring agent may include carbon black, metal such as chrome, or oxides thereof. The pixel-defining films PDL may cover portions of the first electrode EL1-1, EL1-2, and EL1-3. In this specification, one component overlapping another component is not limited to having the same area and shape as the other component, but includes having a different area and/or different shape from the other component.

The first electrode EL1-1, EL1-2, or EL1-3 may be an anode or a cathode. In addition, the first electrode EL1-1, EL1-2, or EL1-3 may be a pixel electrode. The first electrode EL1-1, EL1-2, or EL1-3 may be a transmissive electrode, a transflective electrode, or a reflective electrode. When the first electrode EL1-1, EL1-2, or EL1-3 is a transmissive electrode, the first electrode EL1-1, EL1-2, or EL1-3 may include a transparent metal oxide, for example, indium tin oxide ("ITO"), indium zinc oxide ("IZO"), zinc oxide (ZnO), indium tin zinc oxide ("ITZO"), etc. When the first electrode EL1-1, EL1-2, or EL1-3 is a transflective electrode or a reflective electrode, the first electrode EL1-1, EL1-2, or EL1-3 may include Ag, Mg, Cu, Al, Pt, Pd, Au, Ni, Nd, Ir, Cr, Li, Ca, LiF/Ca, LiF/Al, Mo, Ti, W, or a compound or mixture thereof (for example, a mixture of Ag and Mg). Alternatively, the first electrode EL1-1, EL1-2, or EL1-3 may have a multilayer structure including a reflective film or transflective film formed of the aforementioned materials, and a transparent conductive film formed of indium tin oxide (ITO), indium zinc oxide (IZO), zinc oxide (ZnO), indium tin zinc oxide (ITZO), etc. In an embodiment, for example, the first electrode EL1-1, EL1-2, or EL1-3 may have a three-layer structure of ITO/Ag/ITO, but an embodiment of the invention is not limited thereto.

The display element layer DP-ED may include a plurality of light-emitting layers EML-1, EML-2, and EML-3. Each of the light-emitting layers EML-1, EML-2, and EML-3 may be provided in pattern inside the pixel opening E_OH defined in the pixel-defining film PDL. The light-emitting layers EML-1, EML-2, and EML-3 may overlap the light-emitting regions PXA-R, PXA-G, and PXA-B in a plan view, respectively. The display element layer DP-ED may include a first light-emitting layer EML-1 corresponding to the first light-emitting region PXA-R, a second light-emitting layer EML-2 corresponding to the second light-emitting region PXA-G, and a third light-emitting layer EML-3 corresponding to the third light-emitting region PXA-B. The light-emitting layers EML-1, EML-2, and EML-3 may emit light having different wavelength ranges. In an embodiment, for example, the first light-emitting layer EML-1 may emit red light, the second light-emitting layer EML-2 may emit green light, and the third light-emitting layer EML-3 may emit blue light.

The light-emitting layers EML-1, EML-2, and EML-3 may each include an organic light-emitting material or an inorganic light-emitting material. In an embodiment, for example, the light-emitting layers EML-1, EML-2, and EML-3 may each include a fluorescent or phosphorescent material. The light-emitting layers EML-1, EML-2, and EML-3 may each include an anthracene derivative, a pyrene derivative, a fluoranthene derivative, a chrysene derivative, a dihydro benzanthracene derivative, or a triphenylene derivative. In addition, the light-emitting layers EML-1, EML-2, and EML-3 may each include a metal organic complex as a light-emitting material. The light-emitting layers EML-1, EML-2, and EML-3 may each also include a quantum dot as a light-emitting material.

The light-emitting layers EML-1, EML-2, and EML-3 may each be provided as a single layer or multiple layers. In an embodiment, for example, when the first light-emitting layer EML-1 is provided as multiple layers, a charge generation layer (not shown) may be disposed between the multiple first light-emitting layers EML-1. However, this is an example, and an embodiment of the invention is not limited thereto.

The second electrode EL2 may be a common electrode. The second electrode EL2 may be a cathode or anode, but an embodiment of the invention is not limited thereto. In another embodiment, for example, when the first electrode EL1-1, EL1-2, or EL1-3 is the anode, the second electrode EL2 may be the cathode; and when the first electrode EL1-1, EL1-2, or EL1-3 is the cathode, the second electrode EL2 may be the anode.

The second electrode EL2 may be a transmissive electrode, a transflective electrode, or a reflective electrode. In an embodiment, the second electrode EL2 is a transmissive electrode, the second electrode EL2 may be composed of a transparent metal oxide, for example, indium tin oxide (ITO), indium zinc oxide (IZO), zinc oxide (ZnO), indium tin zinc oxide ITZO, etc.

Although not illustrated in the drawing, a hole transport region (not shown) may be disposed between the first electrodes EL1-1, EL1-2, and EL1-3 and the light-emitting layers EML-1, EML-2, and EML-3, and the hole transport region may include at least one of a hole transport layer, a hole injection layer, or an electron-blocking layer. In addition, an electron transport region (not shown) may be disposed between the light-emitting layers EML-1, EML-2, and EML-3 and the second electrode EL2, and the electron transport region may include at least one of an electron transport layer, an electron injection layer, or a hole-blocking layer. The hole transport region and the electron transport region may each be provided as a common layer, or provided in pattern in the pixel openings E_OH.

The display element layer DP-ED may further include a capping layer CPL disposed on the second electrode EL2. The capping layer CPL may include a single layer or multiple layers. The capping layer CPL may include an organic material or inorganic material. In an embodiment, the capping layer CPL may be an organic layer or an inorganic layer. In an embodiment, for example, when the capping layer CPL includes an inorganic material, the inorganic material may include an alkali metal compound such as LiF, an alkaline earth metal compound such as MgF2, silicon oxynitride, silicon nitride, silicon oxide, etc. In an embodiment, for example, when the capping layer CPL includes an organic material, the organic material may include α-NPD, NPB, TPD, m-MTDATA, Alq3, CuPc, TPD15(N4,N4,N4',N4'-tetra (biphenyl-4-yl) biphenyl-4,4'-diamine), TCTA(4,4',4"-Tris (carbazol-9-yl) triphenylamine), etc., or may include an epoxy resin, or acrylate such as methacrylate.

The capping layer CPL may have a refractive index of about 1.6 or more. In an embodiment, for example, the capping layer CPL may have a refractive index of at least about 1.6 with respect to light in a wavelength range of about 550 nm to about 660 nm. The capping layer CPL may improve light efficiency due to the principle of constructive interference. The capping layer CPL may be omitted in an embodiment of the invention.

The encapsulation layer TFE may seal the display element layer DP-ED. The encapsulation layer TFE may include at least one inorganic film (hereinafter, an "inorganic encapsulation film"). In addition, the encapsulation layer TFE may include at least one organic film (hereinafter, an "organic encapsulation film") and at least one inorganic encapsulation film. The inorganic encapsulation film may protect the display element layer DP-ED from moisture/oxygen, and the organic encapsulation film may protect the display element layer DP-ED from foreign substances such as dust particles. The inorganic encapsulation film may include silicon nitride, silicon oxynitride, silicon oxide, titanium oxide, aluminum oxide, or the like, but an embodiment of the invention is not limited particularly thereto. The organic encapsulation film may include an acrylate-based compound, an epoxy-based compound, etc. The organic encapsulation film may include a photopolymerizable organic material, but an embodiment of the invention is not limited particularly thereto.

The input-sensing layer ISL may include a base insulation layer IS_L2, a first conductive layer IS_C1 disposed on the base insulation layer IS_L2, a second conductive layer IS_C2 disposed on the first conductive layer IS_C1, and a middle insulation layer IS_L1 disposed between the first conductive layer IS_C1 and the second conductive layer IS_C2. The base insulation layer IS_L2 may include a single layer or multiple layers. The base insulation layer IS_L2 may include an organic material or inorganic material. The base insulation layer IS_L2 may include at least one of silicon nitride, silicon oxynitride, or silicon oxide. Alternatively, the base insulation layer IS_L2 may include an epoxy resin, an acrylate resin, or an imide-based resin.

The middle insulation layer IS_L1 may include an organic material or inorganic material. In an embodiment, for example, the middle insulation layer IS_L1 may include at least one of an epoxy-based resin, a urethane-based resin, a cellulose-based resin, a siloxane-based resin, a polyimide-based resin, a polyamide-based resin, or perylene-based resin. Alternatively, the middle insulation layer IS_L1 may include at least one of aluminum oxide, titanium oxide, silicon oxide, silicon nitride, silicon oxynitride, zirconium oxide, or hafnium oxide.

The first conductive layer IS_C1 and the second conductive layer IS_C2 may each include a single layer or multiple layers. The first conductive layer IS_C1 and the second conductive layer IS_C2 may each include a metal layer or a transparent conductive layer as a single layer. The metal layer may include molybdenum (Mo), silver (Ag), titanium (Ti), copper (Cu), aluminum (Al), or an alloy thereof. The transparent conductive layer may include a transparent conductive oxide such as indium tin oxide (ITO), indium zinc oxide (IZO), and indium tin zinc oxide (ITZO). In addition, the transparent conductive layer may include a conductive polymer such as PEDOT, metal nanowires, graphene, etc.

Alternatively, the first conductive layer IS_C1 and the second conductive layer IS_C2 may each include at least one metal layer and at least one transparent conductive layer. In an embodiment, for example, the first conductive layer IS_C1 and the second conductive layer IS_C2 may each have a three-layer structure of ITO/Ag/ITO.

The optical layer OPL may include pattern parts CPT and first to third filters CF1, CF2, and CF3. The pattern parts CPT may have pattern openings P_OH defined therein. The first to third filters CF1, CF2, and CF3 may be disposed to fill the pattern openings P_OH. In addition, the optical layer OPL may further include an overcoat layer OC disposed on the pattern parts CPT and the first to third filters CF1, CF2, and CF3.

A material constituting the pattern part CPT is not particularly limited as long as absorbing light. The pattern parts CPT may have a black color, and may include a black coloring agent. The black coloring agent may include a black dye or black pigment. The black coloring agent may include carbon black, metal such as chrome, or oxides thereof.

The first to third filters CF1, CF2, and CF3 may be disposed corresponding to the light-emitting layers EML-1, EML-2, and EML-3. The optical layer OPL may include a first filter CF1 corresponding to the first light-emitting layer EML-1, a second filter CF2 corresponding to the second light-emitting layer EML-2, and a third filter CF3 corresponding to the third light-emitting layer EML-3. The first to third filters CF1, CF2, and CF3 may each include a dye or pigment. In an embodiment, for example, the first filter CF1 may be a red color filter, the second filter CF2 may be a green color filter, and the third filter CF3 may be a blue color filter. Accordingly, the optical layer OPL including the first to third filters CF1, CF2, and CF3 may improve the display quality of the display device DD.

The overcoat layer OC may cover the pattern parts CPT and the first to third filters CF1, CF2, and CF3. The overcoat layer OC may include an organic material. The overcoat layer OC may be a planarization layer. The protective layer PF may be disposed on the overcoat layer OC. Since the protective layer PF with improved impact resistance is directly disposed on the display module DM, the display module DM may be protected from external impact.

Figure 7:
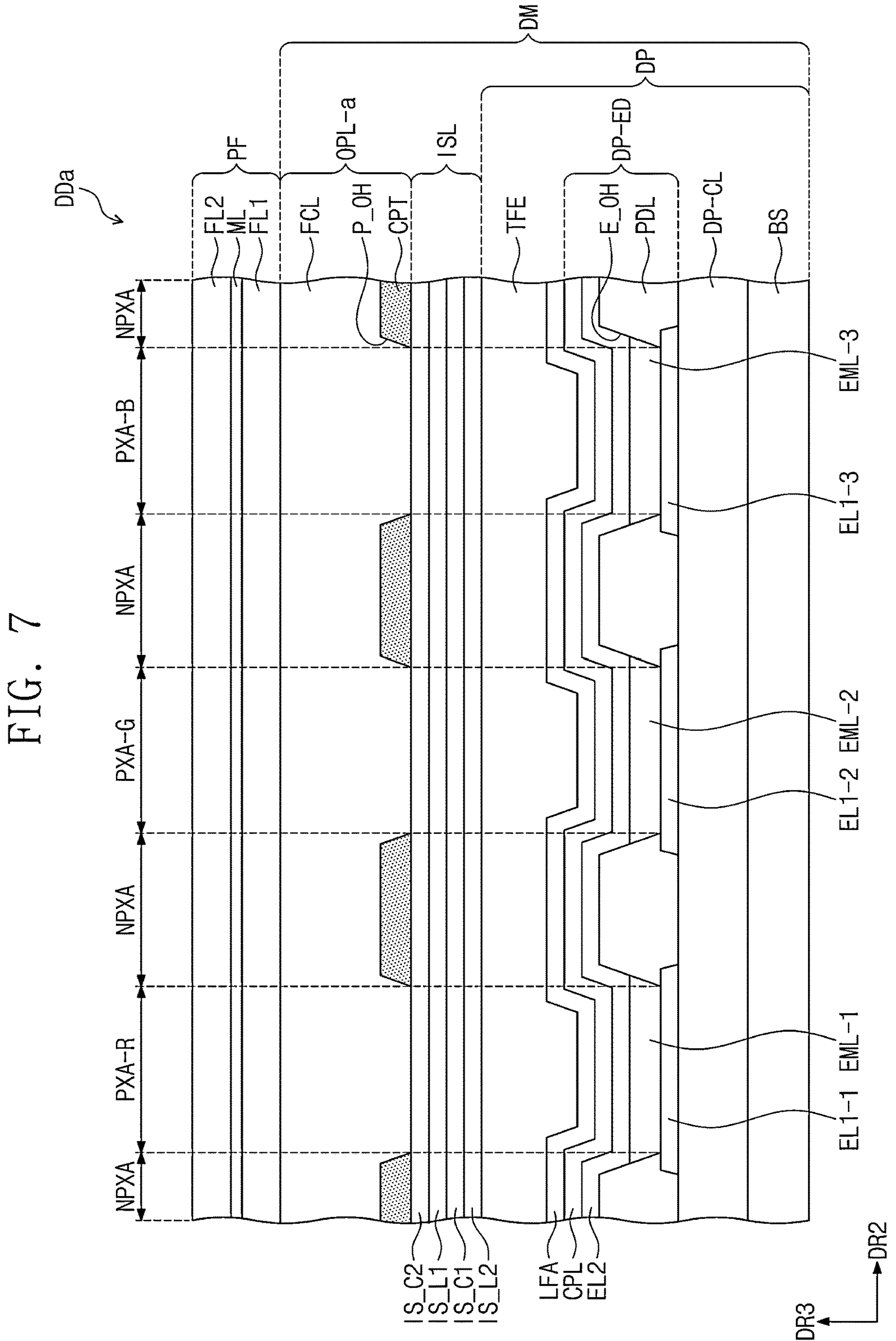
FIG. 7 is a cross-sectional view of a display device according to an embodiment of the invention.

FIG. 7 is a cross-sectional view of a display device according to an embodiment of the invention. Duplicate description made with reference to FIG. 6 will be omitted herein.

Referring to FIG. 7, an optical layer OPL-a included in a display device DDa differs from the optical layer OPL illustrated in FIG. 6 in that the optical layer OPL-a includes a light control layer FCL instead of the first to third filters CF1, CF2, and CF3. In addition, FIG. 7 illustrates that a low reflection layer LFA is further disposed between a display element layer DP-ED and an encapsulation layer TFE.

The light control layer FCL may fill pattern openings P_OH, and may be disposed on pattern parts CPT. The light control layer FCL may be an anti-reflection layer that reduces a reflectance for external light incident from the outside. The light control layer FCL may be a layer that selectively transmits light emitted from a display panel DP. The light control layer FCL may include a dye or pigment. The dye or pigment included in the light control layer FCL may be a material that transmits light only in a particular wavelength range among light emitted from the display element layer DP-ED. Accordingly, the optical layer OPL-a including the light control layer FCL may improve the display quality and light efficiency of the display device DD. According to an embodiment, the light control layer FCL may be a planarization layer.

A low reflection layer LFA may be disposed on the display element layer DP-ED. In an embodiment, for example, the low reflection layer LFA may be disposed on a capping layer CPL, or disposed on a second electrode EL2 when the capping layer CPL is omitted. The low reflection layer LFA may include an inorganic material having a low reflectance, and may include metal or metal oxide. In an embodiment, for example, the low reflection layer LFA may include ytterbium (Yb), bismuth (Bi), cobalt (Co), molybdenum (Mo), titanium (Ti), zirconium (Zr), aluminum (Al), chrome (Cr), niobium (Nb), platinum (Pt), tungsten (W), indium (In), tin (Sn), iron (Fe), nickel (Ni), tantalum (Ta), manganese (Mn), zinc (Zn), germanium (Ge), silver (Ag), magnesium (Mg), gold (Au), copper (Cu), calcium (Ca), or a combination thereof. In another embodiment, the low reflection layer LFA may include, for example, $SiO_2$, $TiO_2$, $ZrO_2$, $Ta_2O_5$, $HfO_2$, $Al_2O_3$, ZnO, $Y_2O_3$, BeO, MgO, $PbO_2$, $WO_3$, SiNx, LiF, $CaF_2$, $MgF_2$, CdS, or a combination thereof.

The low reflection layer LFA may have an absorption coefficient (k) of about 1.5 or less. In an embodiment, for example, the absorption coefficient of the low reflection layer LFA may be greater than about 0.5 and equal to or less than about 1.5. The low reflection layer LFA may reduce light reflectance when the absorption coefficient thereof is greater than about 0.5, and equal to or less than about 1.5.

The low reflection layer LFA may induce destructive interference of light incident into the display device DD and light reflected from the metal (for example, a second electrode) disposed under the low reflection layer LFA, thereby reducing the external light reflectance. Accordingly, the display device DD including the low reflection layer LFA may have improved display quality and light efficiency.

Figure 8A:
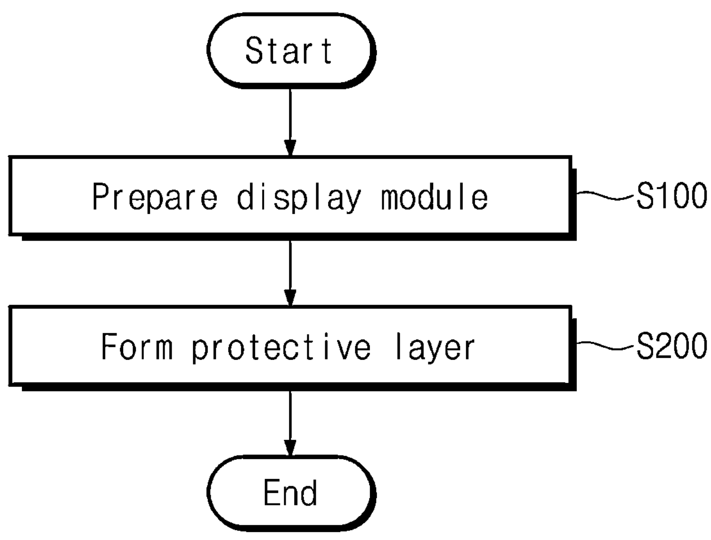
FIGS. 8A and 8B are flowcharts illustrating a method for manufacturing a display device according to an embodiment of the invention.
Figure 8B:
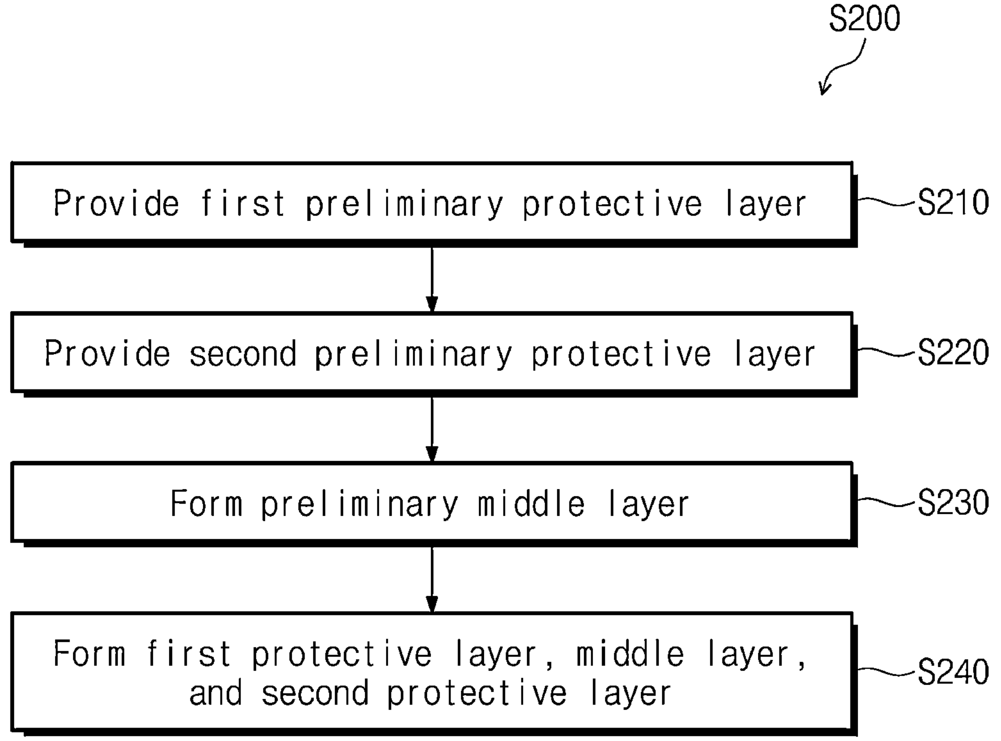

FIGS. 8A and 8B are flowcharts illustrating a method for manufacturing a display device according to an embodiment of the invention. FIGS. 9A through 9G are process diagrams schematically illustrating operations of manufacturing a display device according to an embodiment of the invention. A display device according to an embodiment of the invention may be formed using the below-described method for manufacturing a display device. Hereinafter, in the description of the method for manufacturing a display device, duplicate description has been previously made with reference to FIGS. 1 through 7 will be omitted.

Referring to FIGS. 3 and 8A, the method for manufacturing a display device according to an embodiment of the invention may include preparing a display module DM (S100) and forming a protective layer PF on the display module DM (S200).

The preparing of the display module DM (S100) may include forming a display panel DP and forming an optical layer OPL, containing a dye or pigment, on the display panel DP. Therefore, the prepared display module DM may include the display panel DP and the optical layer OPL.

Referring to FIGS. 4 and 8B, the forming of the protective layer PF (S200) may include providing a first preliminary protective layer (S210), providing a second preliminary protective layer on the first preliminary protective layer (S220), forming a preliminary middle layer (S230), and forming a first protective layer FL1, a middle layer ML, and a second protective layer FL2 by curing the first preliminary protective layer, the preliminary middle layer, and the second preliminary protective layer, respectively (S240).

The forming of the protective layer PF (S200) may be performed at room temperature to about 80° C. The protective layer PF may be directly formed on the display module DM. When the protective layer PF is formed at a temperature exceeding about 80° C., components, such as a light-emitting layer, included in the display module DM may be damaged. When the protective layer PF is formed at a temperature below room temperature (for example, less than about 20° C.), it may be difficult to provide the first and second preliminary protective layers P-FL1 and P-FL2 (see FIG. 9D) for forming the protective layer PF. Accordingly, the method for manufacturing a display device including the forming of the protective layer PF on the display module DM at room temperature to about 80° C. may exhibit excellent manufacturing efficiency and reliability.

Figure 9A:
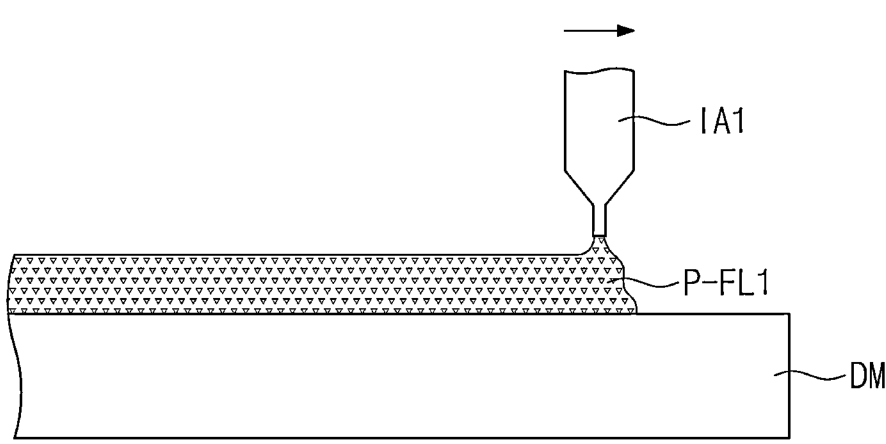
FIGS. 9A through 9G are process diagrams schematically illustrating operations of manufacturing a display device according to an embodiment of the invention.

FIG. 9A is a drawing illustrating the providing of the first preliminary protective layer P-FL1 on the display module DM. The first preliminary protective layer P-FL1 may be directly provided on the display module DM. In the case where the first preliminary protective layer P-FL1 is provided on a separate temporary member to form the first protective layer FL1 (see FIG. 9G), and then the first protective layer FL1 is coupled to the display module DM, a manufacturing operation is added and thus the manufacturing cost and time increase. On the contrary, in the method for manufacturing a display device according to an embodiment of the invention, the first preliminary protective layer P-FL1 is directly provided on the display module DM, and thus the method may exhibit excellent manufacturing efficiency.

The first preliminary protective layer P-FL1 may be provided through inkjet printing, dispensing, or slot-die coating. According to what is illustrated in the drawing, the first preliminary protective layer P-FL1 may be provided through a first injection device IA1. However, this is an example, and the device for providing the first preliminary protective layer P-FL1 is not limited thereto.

The first preliminary protective layer P-FL1 may include a composition having a first base material (or first solute) and a first solvent. The first base material may include at least one of an epoxy-based resin, a urethane-based resin, an acrylate-based resin, or a silicon-based resin. In an embodiment, for example, the first base material may include at least one of an epoxy-based resin or a PCL-based resin. However, an embodiment of the invention is not limited thereto, and the first base material may further include a material for improving impact resistance within the scope of not degrading the display quality and the process reliability of the display device DD (see FIG. 1) in another embodiment.

The first preliminary protective layer P-FL1 may include about 5 wt % to about 20 wt % of the first solvent with respect to a total weight of the first preliminary protective layer P-FL1. In particular, the first preliminary protective layer P-FL1 may include about 5 wt % to about 10 wt % of the first solvent. The composition including more than about 20 wt % of the first solvent causes "flow", thereby resulting in a decrease in shape retention, or the composition is not applied in a uniform thickness and/or uniform amount, thereby making it difficult to form the first preliminary protective layer P-FL1. "Flow" refers to a phenomenon in which the composition flows out of the display module DM. According to an embodiment of the invention, the first preliminary protective layer P-FL1, including about 5 wt % to about 20 wt % of the first solvent with respect to the total weight, may be applied in a uniform thickness and a uniform amount, and may thus exhibit excellent shape retention. According to an embodiment, the first solvent may include propylene glycol methyl ether (PGME) or propylene glycol methyl ether acetate (PGMEA).

Figure 9B:
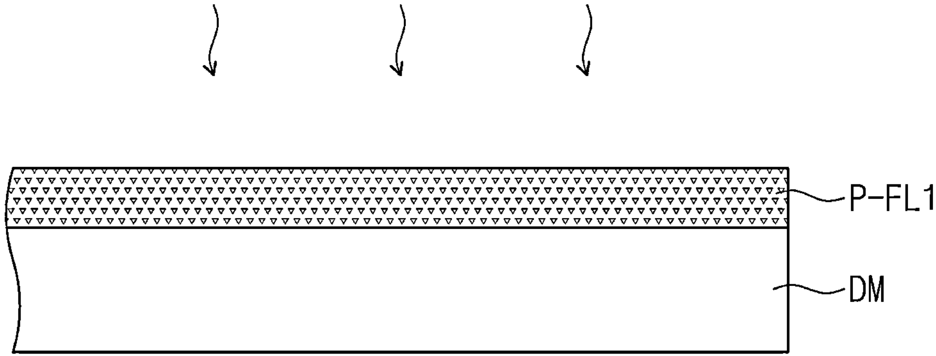

FIG. 9B is a drawing illustrating subjecting the first preliminary protective layer P-FL1, directly provided on the display module DM, to pre-drying. As subjecting the first preliminary protective layer P-FL1 to pre-drying, a part of the first solvent included in the first preliminary protective layer P-FL1 may evaporate. That is, the subjecting of the first preliminary protective layer P-FL1 to pre-drying may be a process for increasing efficiency of a final-drying operation by primarily evaporating a part of the first solvent included in the first preliminary protective layer P-FL1 before finally drying the first preliminary protective layer P-FL1.

Figure 9C:
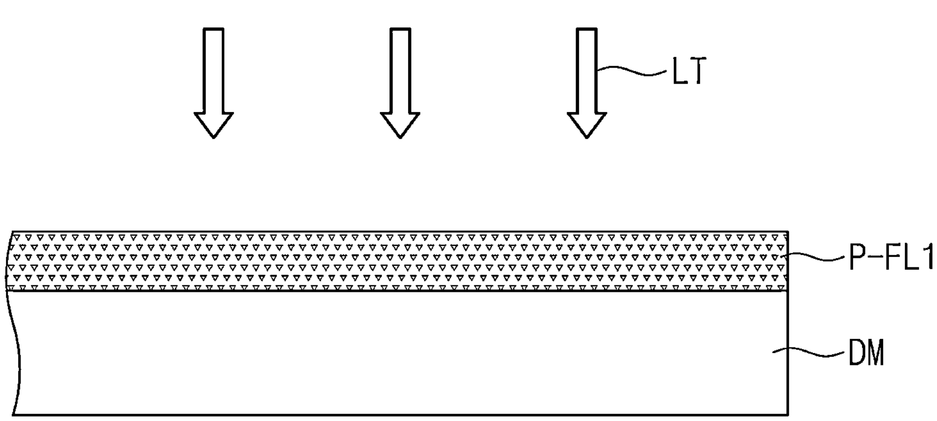

FIG. 9C is a drawing illustrating subjecting the first preliminary protective layer P-FL1, directly provided on the display module DM, to temporary-curing. In the subjecting of the first preliminary protective layer P-FL1 to temporary-curing, heat (not shown) or light LT may be provided. FIG. 9C exemplarily illustrates that the light LT is provided to the first preliminary protective layer P-FL1 to temporarily cure the first preliminary protective layer P-FL1. The subjecting of the first preliminary protective layer P-FL1 to temporary-curing may be a process for increasing efficiency of a final-curing operation by temporarily curing the first preliminary protective layer P-FL1 first before finally curing the first preliminary protective layer P-FL1.

Figure 9D:
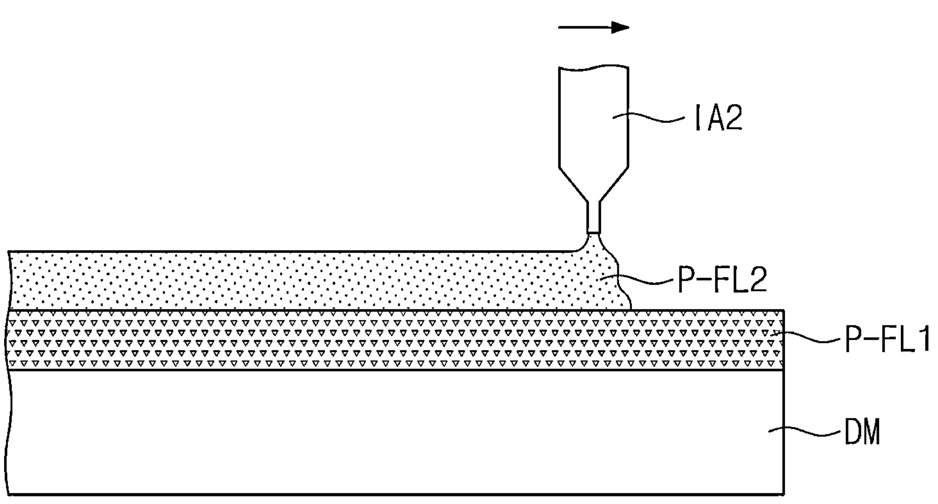

FIG. 9D is a drawing illustrating providing a second preliminary protective layer P-FL2 on the first preliminary protective layer P-FL1. The second preliminary protective layer P-FL2 may be directly provided on the first preliminary protective layer P-FL1.

The second preliminary protective layer P-FL2 may be provided through inkjet printing, dispensing, or slot-die coating. FIG. 9D illustrates that the second preliminary protective layer P-FL2 is provided through a second injection device IA2. However, this is an example, and the device for providing the second preliminary protective layer P-FL2 is not limited thereto.

The second preliminary protective layer P-FL2 may include a composition having a second base material (or second solute) and a second solvent. The second base material may include at least one of an epoxy-based resin, a urethane-based resin, an acrylate-based resin, or a silicon-based resin. The second base material may be different from the first base material. In an embodiment, for example, the second base material may include a polysilsesquioxane-based resin. However, an embodiment of the invention is not limited thereto, and the second base material may further include a material for improving impact resistance within the scope of not degrading the display quality and process reliability of the display device DD (see FIG. 1) in another embodiment.

The second preliminary protective layer P-FL2 may include about 5 wt % to about 20 wt % of the second solvent with respect to a total weight of the second preliminary protective layer P-FL2. In particular, the second preliminary protective layer P-FL2 may include about 5 wt % to about 10 wt % of the second solvent. The second solvent may be the same as the first solvent. The composition including more than about 20 wt % of the second solvent causes "flow", thereby resulting in a decrease in shape retention, or the composition is not applied in a uniform thickness and/or uniform amount, thereby making it difficult to form the second preliminary protective layer P-FL2. "Flow" refers to a phenomenon in which the composition flows out of the first preliminary protective layer P-FL1. According to an embodiment of the invention, the second preliminary protective layer P-FL2, including about 5 wt % to about 20 wt % of the second solvent with respect to the total weight, may be applied in a uniform thickness and a uniform amount, and may thus exhibit excellent shape retention. According to an embodiment, the second solvent may include methyl isobutyl ketone (MIBK), propylene glycol methyl ether (PGME), or propylene glycol methyl ether acetate (PGMEA).

Figure 9E:
Figure 9E:
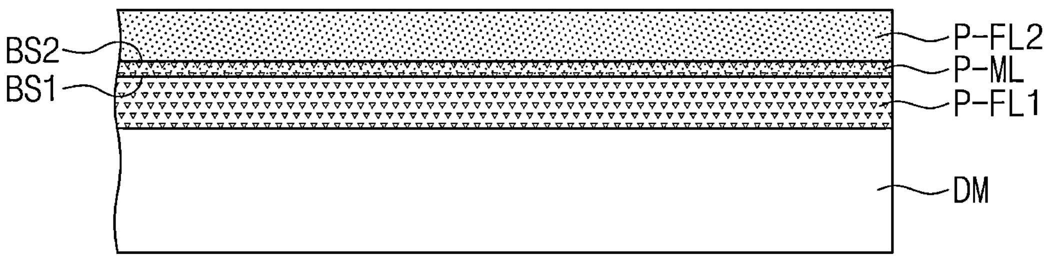

FIG. 9E is a drawing illustrating forming a preliminary middle layer P-ML. The preliminary middle layer P-ML may be formed through a process in which the second solvent included in the second preliminary protective layer P-FL2 serves as a solvent for dissolving the first preliminary protective layer P-FL1, and thus an upper part of the first preliminary protective layer P-FL1 is dissolved by the second solvent. In particular, the second preliminary protective layer P-FL2 may be provided on the first preliminary protective layer P-FL1, the second solvent may dissolve the first preliminary protective layer P-FL1, and the preliminary middle layer P-ML, in which the first base material included in the first preliminary protective layer P-FL1 and the second base material included in the second preliminary protective layer P-FL2 are mixed together, may be formed. The first base material and the second base material may be mixed together and distributed uniformly inside the preliminary middle layer P-ML. The first base material and the second base material may be included in the preliminary middle layer P-ML in equal proportions, but an embodiment of the invention is not limited thereto. The preliminary middle layer P-ML may include small amounts of the first solvent and the second solvent.

In another embodiment, unlike what is illustrated in the drawing, the forming of the preliminary middle layer P-ML may be performed between the forming of the first preliminary protective layer P-FL1 and the forming of the second preliminary protective layer P-FL2. That is, the preliminary middle layer P-ML may be directly formed on the first preliminary protective layer P-FL1, and the second preliminary protective layer P-FL2 may be formed on the preliminary middle layer P-ML. In this case, the preliminary middle layer P-ML may be different in physical properties from each of the first preliminary protective layer P-FL1 and the second preliminary protective layer P-FL2. The preliminary middle layer P-ML may include the first base material and the second base material. In particular, the preliminary middle layer P-ML may include the first base material and the second base material in equal proportions, but an embodiment of the invention is not limited thereto.

Referring to FIG. 9E, the forming of the preliminary middle layer P-ML may further include drying. By drying the first preliminary protective layer P-FL1, the preliminary middle layer P-ML, and the second preliminary protective layer P-FL2, the first solvent and the second solvent included in the first preliminary protective layer P-FL1, the preliminary middle layer P-ML, and the second preliminary protective layer P-FL2 may be evaporated and removed. After the drying, the proportion of the solvent included in each of the first preliminary protective layer P-FL1, the preliminary middle layer P-ML, and the second preliminary protective layer P-FL2 may reduce to about 0 wt % to about 3 wt %.

Figure 9F:
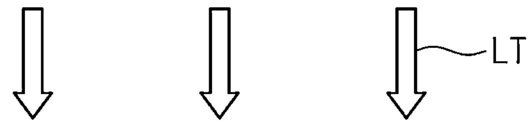
Figure 9F:
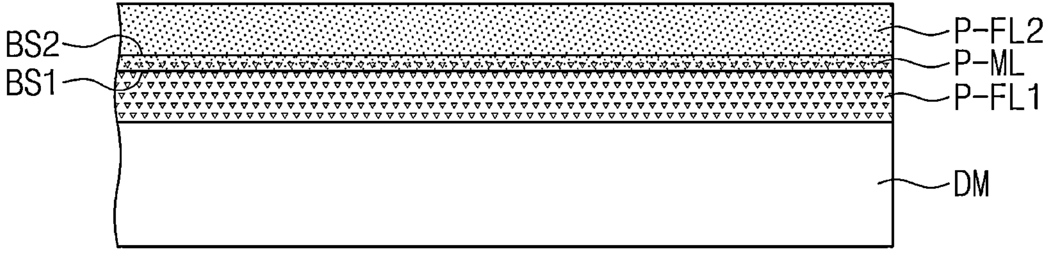
Figure 9G:
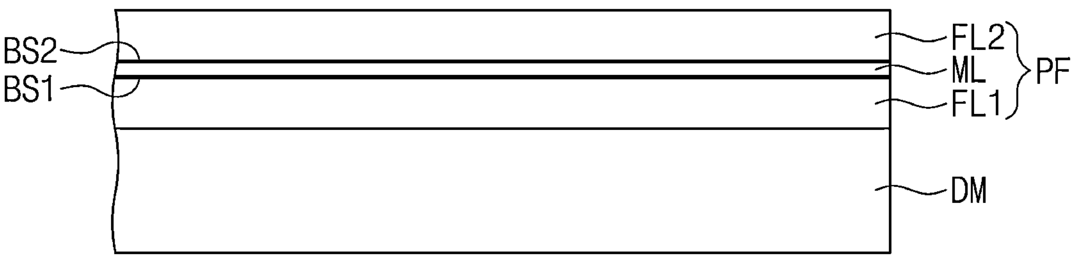

FIGS. 9F and 9G are drawings illustrating forming a first protective layer FL1, a middle layer ML, and a second protective layer FL2 by curing the first preliminary protective layer P-FL1, the preliminary middle layer P-ML, and the second preliminary protective layer P-FL2, respectively. After the drying, a first boundary surface BS1 may be formed between the preliminary middle layer P-ML and the first preliminary protective layer P-FL1, and a second boundary surface BS2 may be formed between the preliminary middle layer P-ML and the second preliminary protective layer P-FL2. That is, as the solvents included in the first preliminary protective layer P-FL1, the preliminary middle layer P-ML, and the second preliminary protective layer P-FL2 are evaporated, the first protective layer FL1, the middle layer ML, and the second protective layer FL2 having different physical properties may be formed as a plurality of layers clearly separated from each other by the first boundary surface BS1 and the second boundary surface BS2.

Referring to FIG. 9F, heat or light LT may be provided in order to cure the first preliminary protective layer P-FL1, the preliminary middle layer P-ML, and the second preliminary protective layer P-FL2. FIG. 9F exemplarily illustrates curing the first preliminary protective layer P-FL1, the preliminary middle layer P-ML, and the second preliminary protective layer P-FL2 by providing the light LT to the first preliminary protective layer P-FL1, the preliminary middle layer P-ML, and the second preliminary protective layer P-FL2. The first protective layer FL1 may be formed from the first preliminary protective layer P-FL1, the middle layer ML may be formed from the preliminary middle layer P-ML, and the second protective layer FL2 may be formed from the second preliminary protective layer P-FL2. The first preliminary protective layer P-FL1, the preliminary middle layer P-ML, and the second preliminary protective layer P-FL2 may be cured in the same operation.

The first protective layer FL1 may have a modulus of about 0.01 Mpa to about 0.1 Mpa, the second protective layer FL2 may have a modulus of about 2 Gpa to about 4 Gpa. The middle layer ML may have a modulus different from the modulus of each of the first protective layer FL1 and the second protective layer FL2. Since the protective layer PF according to an embodiment of the invention includes three layers having different moduli from each other, the display device DD (see FIG. 1) according to an embodiment of the invention may have improved impact resistance. The protective layer PF may have a modulus of about 4 Gpa to about 5 Gpa.

In a display device according to an embodiment of the invention, a protective layer disposed on a display panel includes a middle layer, which is different in physical properties from each of a first protective layer and a second protective layer, and therefore, the display device may exhibit excellent impact resistance.

A method for manufacturing a display device according to an embodiment of the invention may form three layers having different physical properties through two coating operations. Accordingly, the process may be simplified, and a display device with improved impact resistance may be achieved.

Although the embodiments of the invention have been described, it is understood that the invention should not be limited to these embodiments but various changes and modifications can be made by one ordinary skilled in the art within the spirit and scope of the invention as hereinafter claimed.

Therefore, the technical scope of the invention should not be limited to the contents described in the detailed description of the specification, but should be defined by the claims.

What is claimed is:

1. A method for manufacturing a display device, comprising:

preparing a display module which includes a display panel and an optical layer disposed on the display panel, wherein the optical layer contains a pigment or dye; and forming a protective layer on the display module, wherein the forming of the protective layer includes providing, on the display module, a first preliminary protective layer having a first base material, providing, on the first preliminary protective layer, a second preliminary protective layer having a second base material different from the first base material, forming, between the first preliminary protective layer and the second preliminary protective layer, a preliminary middle layer having the first base material and the second base material, and forming a first protective layer, a middle layer, and a second protective layer by curing the first preliminary protective layer, the preliminary middle layer, and the second preliminary protective layer, respectively, wherein the first protective layer, the second protective layer, and the middle layer have respective moduli different from each other.

2. The method of claim 1, wherein the first preliminary protective layer includes about 5 percentages by weight (wt %) to about 20 wt % of a solvent with respect to a total weight of the first preliminary protective layer.

3. The method of claim 2, wherein the second preliminary protective layer includes about 5 wt % to about 20 wt % of a solvent with respect to a total weight of the second preliminary protective layer.

4. The method of claim 1, wherein the first preliminary protective layer includes a first solvent, the second preliminary protective layer includes a second solvent, and the first solvent is the same as the second solvent.

5. The method of claim 4, wherein the providing of the preliminary middle layer comprises dissolving the first preliminary protective layer using the second solvent.

6. The method of claim 5, wherein the forming of the preliminary middle layer further comprises removing the first and second solvents by drying each of the first preliminary protective layer, the preliminary middle layer, and the second preliminary protective layer.

7. The method of claim 6, wherein after the drying, a proportion of sum of the first and second solvents included in each of the first preliminary protective layer, the preliminary middle layer, and the second preliminary protective layer is about 0 wt % to about 3 wt % with respect to a total weight of a corresponding layer.

8. The method of claim 1, further comprising, before the providing of the second preliminary protective layer, subjecting the first preliminary protective layer to pre-drying and temporary-curing.

9. The method of claim 1, wherein the forming of the preliminary middle layer is performed between the providing of the first preliminary protective layer and the providing of the second preliminary protective layer.

* * * * *